United States Patent [19]

Tanaka

[11] 4,365,284

[45] Dec. 21, 1982

[54] RESISTOR MODULE

[75] Inventor: Katsuo Tanaka, Kawasaki, Japan

[73] Assignee: Fujitsu Limited, Kawasaki, Japan

[21] Appl. No.: 139,167

[22] Filed: Apr. 11, 1980

[30] Foreign Application Priority Data

Apr. 27, 1979 [JP] Japan .................................. 54-52122

[51] Int. Cl.³ .............................................. H01C 1/14
[52] U.S. Cl. ............................... 361/395; 174/52 PE; 338/320; 361/407
[58] Field of Search ................ 361/407, 395; 338/320, 338/48, 260, 319; 174/52 PE

[56] References Cited

U.S. PATENT DOCUMENTS

| 3,437,883 | 4/1969 | Smith .......................... 174/52 PE X |
| 3,491,267 | 1/1970 | Goshorn ............................. 361/407 |
| 3,585,455 | 6/1971 | Naylor ................................ 361/407 |
| 3,638,162 | 1/1972 | McWade ............................. 338/320 |
| 3,646,409 | 2/1972 | Water et al. ................. 174/52 PE X |
| 3,745,508 | 7/1973 | Bruder et al. ........................ 338/320 |
| 3,964,087 | 6/1976 | Mallon ............................. 338/320 X |
| 4,245,273 | 1/1981 | Feinberg et al. ..................... 361/382 |
| 4,249,157 | 2/1981 | Sakamoto ........................ 338/320 X |

FOREIGN PATENT DOCUMENTS 2820153 11/1959 Fed. Rep. of Germany ...... 338/320

Primary Examiner—R. R. Kucia
Attorney, Agent, or Firm—Staas & Halsey

[57] ABSTRACT

A resistor module which is small in size and easy to probe for measuring and in which a plurality of resistors are formed on the surface of an insulated substrate, an insulating layer is provided to extend over the resistors and conductor patterns for connection of the resistors, and a conductor bar to be connected with a power source pattern or grounding pattern of a printed circuit board is mounted on the insulating layer.

5 Claims, 4 Drawing Figures

RESISTOR MODULE

BACKGROUND OF THE INVENTION

1. Field of the Invention

This invention relates to a resistor module having assembled together a plurality of resistors for package on a printed circuit board.

2. Description of the Prior Art

On a printed circuit board for constituting an electronic instrument there are packaged a number of circuit elements such as a terminal resistor, a bypass condenser and so forth together with an LSI (Large Scale Integrated circuit). For enhancement of the package density of such a printed circuit board, it has been proposed to assemble together a plurality of resistors into a module.

In the printed circuit board having packaged thereon an LSI and various circuit elements, it is necessary to measure the operative state of the printed circuit as by observation of signal waveforms available from the circuit. To this end, in a conventional printed circuit board pads are formed for contact with a probe for measurement; however, since a number of such pads are provided, the printed circuit board inevitably becomes bulky. The measurement may also be effected by contacting the probe with connection terminals of the LSI and the circuit elements, but, for example, the connection terminals on the signal generating side and the connection terminals on the grounding side are relatively spaced apart in many cases and no rapid or accurate measurement can be achieved.

SUMMARY OF THE INVENTION

It is an object of the present invention to provide a miniatured resistor module having assembled together a plurality of resistors for package on a printed circuit board.

Another object of the present invention is to facilitate probing of a resistor module.

Yet another object of the present invention is to assemble together capacitors such as a bypass capacitor and like circuit elements into one unit thereby to provide for enhanced package density of a printed circuit board.

Briefly stated, in the resistor module of the present invention which has a plurality of resistors formed on the surface of an insulated substrate and connection leads for the resistors, an insulating layer is formed to extend over the resistors and conductor patterns for connection with the resistors, and a conductor bar to be connected with a power source or grounding pattern of a printed circuit board is mounted on the insulating layer.

DESCRIPTION OF THE PREFERRED EMBODIMENTS

Figure 1:
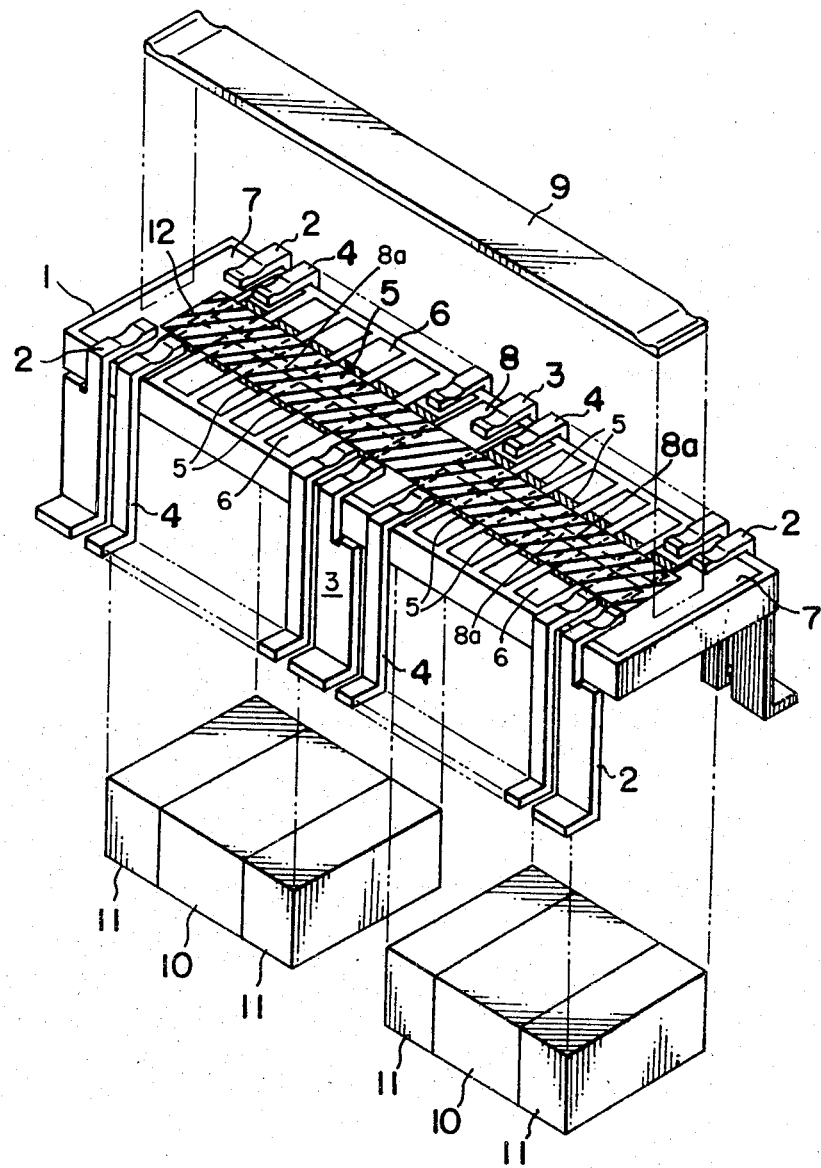
FIG. 1 is an exploded perspective view showing an embodiment of the present invention.

In FIG. 1, reference numeral 1 indicates an insulated substrate as of ceramic, 2 designates grounding leads disposed on both side portions of the insulated substrate 1; 3 identifies positive or negative power source leads disposed at the central portion of the insulated substrate 1; 4 denotes signal leads disposed between the gounding leads 2 and the power source leads 3; 5 represents resistors formed on the insulated substrate 1; 6 shows pads for connection of the signal leads 4 to the resistors; 7 refers to pads for connection of the grounding leads 2; 8 indicates a pad for connection of the power source leads 3; 9 designates a conductor bar; 10 identifies ceramic chip capacitors; 11 denotes electrodes of the capacitors 10; and 12 represents an insulating layer as of a polyimide film.

The resistors 5 and the pads 6, 7 and 8 are formed by known printing or evaporation techniques on the insulated substrate 1. The pads 6, 7 and 8, the leads 2, 3 and 4 and the conductor bar 9 can be connected together by means of soldering, welding, thermal compression bonding, a conductive adhesive binder or the like. In this case, each resistor 5 is connected at one end to an extension 8a of the pad 8 and at the other end to one of the pads 6. The insulating layer 12 may be formed by a polyimide film or like insulating film, or by coating an insulating paint. The insulating layer 12 is formed to partly overlie the resistors 5 and the pad 8 and completely overlie extensions 8a. The conductor bar 9 is mounted on the insulating layer 12 and connected at both ends to the pads 7 to serve as a gounding bar when the leads 2 are grounded. Or, if the leads 2 are used as power source leads, then the conductor bar 9 functions as a power source bar.

Though not shown, pads are also formed on the underside of the insulated substrate 1 and the electrodes 11 of the capacitors 10 are connected to the pads and thus the capacitors 10 are connected between the leads 2 and 3.

The resistor module of the above arrangement is packaged on a printed circuit board together with LSI elements. The resistors 5 are each connected, for example, to each input/output terminal of one of the LSI elements via one of the leads 4 to serve as a termination resistor, and the capacitors 10 are each connected between the power source and the ground to act as a bypass condenser.

Figure 3:
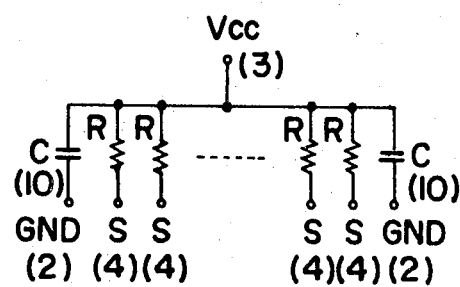
FIG. 3 shows an equivalent circuit of the embodiment depicted in FIG. 1.
Figure 2:
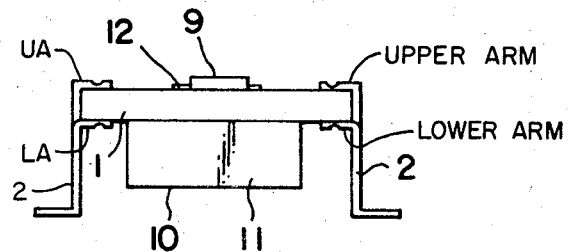
FIG. 2 is a front view of embodiment shown in FIG. 1.

FIG. 2 is a front view of the embodiment shown in FIG. 1. The conductor bar 9 is provided to extend the entire length of the insulating layer 12 overlying the resistors on the surface of the insulated substrate 1. The electrodes 11 of the condensers 10 are connected with the pads formed on the underside of the insulated substrate 1. The top end portion of each lead 2 is divided into upper and lower arms (UA, LA) so that they hold therebetween the insulated substrate 1 and are respectively connected to the corresponding pads on the top and bottom sides of the insulated substrate 1. Therefore, there is no need to provide any through holes in the substrate 1 for connecting to both sides of it. The leads 3 are similar in configuration to the leads 2 and are also respectively connected to the corresponding pads on both sides of the insulated substrate 1. As a consequence, an equivalent circuit of the resistor module is such as shown in FIG. 3. In FIG. 3, parenthesized reference numerals correspond to those in FIGS. 1 and 2, resistors R and capacitors C are connected at one end to a terminal (the lead 3) to be supplied with a power source voltage Vcc, and the other ends of the condensers C and the resistors R are connected to ground terminals GND (the leads 2) and signal terminals S (the leads 4), respectively.

Since the conductor bar 9 overlies the insulating layer 12 on the resistors 5 and the connecting conductor pattern such as the extensions 8a of the pad 8, probes can be contacted with the conductor bar 9 and the head of a lead 4 of a desired one of the resistors 5 to be measured; furthermore, since the distance between them is short, the probing operation is easy. Moreover, since the conductor bar 9 is provided cubically, the resistor module does not become bulky, and accordingly the package density on the printed circuit board can be enhanced.

Figure 4:
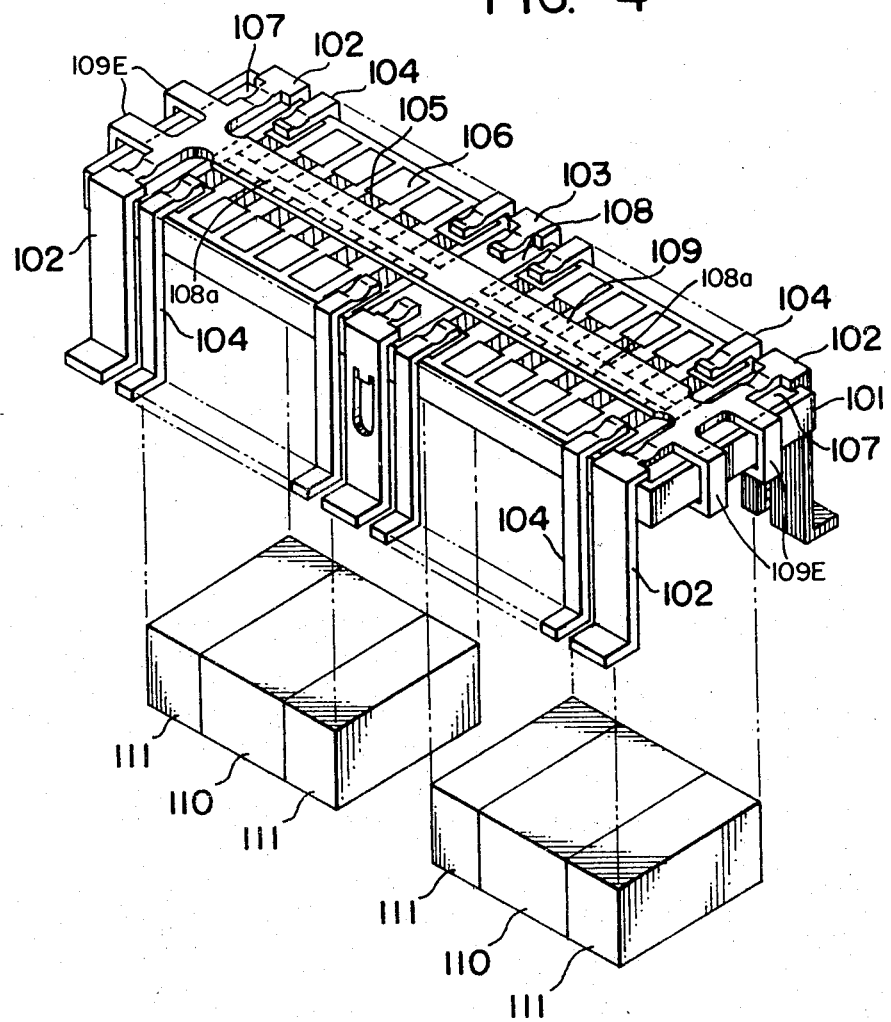
FIG. 4 is an exploded perspective view illustrating another embodiment of the present invention.

FIG. 4 is an exploded perspective view showing another embodiment of the present invention. As is the case with the foregoing embodiment, resistors 105 and pads 106, 107 and 108 are formed on an insulated substrate 101 as of ceramic and pads (not shown) are also formed on the underside of the insulated substrate 101. To the pads 106 and 108 are connected signal leads 104 and power source leads 103 respectively, and electrodes 111 of capacitors 110 are respectively connected to the corresponding pads on the underside of the insulated substrate 101. Grounding leads 102 for connection with the pads 107 and a conductor bar 109 are formed as a unitary structure, and the conductor bar 109 is disposed to overlie without contact the resistors 105 and a connecting conductor pattern 108a therefor by an insulating layer, which is not shown in FIG. 4. Both end portions 109E of the conductor bar 109 are extended and bent to make connections with the pads formed on the underside of the insulated substrate 101.

Also in this embodiment, if the leads 102 are grounded, then the conductor bar 109 serves as a grounding bar, whereas if the leads 102 are connected to a positive or negative power source, then the conductor bar 109 functions as a power source bar. By contacting probes with the head of one of the leads 104 and the conductor bar 109, a signal waveform occurring between desired ones of the resistors 105 can easily be observed.

As has been described in the foregoing, according to the present invention, a plurality of resistors are formed on one surface of an insulated substrate, a conductor bar is provided on the resistors and a connecting conductor pattern therefor with an insulating layer sandwiched therebetween, and the conductor bar is connected by end leads to either a power source pattern or a grounding pattern of the printed circuit board. The utilization of the conductor bar permits easy probing. Further, by providing capacitors on the underside of the insulated substrate to form bypass condensers, the package density on a printed circuit board can be enhanced.

It will be apparent that many modifications and variations may be effected without departing from the scope of the novel concepts of this invention.

What is claimed is:

1. A resistor module for use with printed circuit boards to increase the element density thereof and to make probing of the module for measuring easy comprising:

a plurality of resistors formed on one surface of an insulated substrate, a connecting conductor pattern, and leads also formed on said insulated substrate for external connection of the resistors;

the plurality of resistors each being connected at one end to an external connection lead and connected together at the other end to a common terminal of the connecting conductor pattern;

an insulating layer provided over the ends of the resistors and being substantially wider than the common terminal connection of the conductor pattern so that said insulating layer completely covers the common terminal connection and also overlaps the common ends of the plurality of resistors connected said common terminal; and a conductor bar of a width greater than that of the common terminal and yet not as wide as said insulating layer provided on the insulating layer to be connected with a power source pattern or grounding pattern of the printed circuit board, the conductor bar thus providing a wide probing contact surface substantially wider than the common terminal along the entire length of the module to permit easy measuring of the individual resistors by a probe having fixed, spaced contacts.

2. A resistor module according to claim 1, wherein the insulating layer is an insulating film.

3. A resistor module according to claim 1, wherein the insulating layer is formed by coating an insulating paint.

4. A resistor module according to claim 1, wherein the leads for the external connection of the resistors with the pattern of the circuit board are formed as a unitary structure with the conductor bar.

5. A resistor module according to claim 1, wherein condensers are connected to the underside of the insulated substrate and connected to leads for external connection thereof with a pattern of the circuit board.

* * * * *

UNITED STATES PATENT AND TRADEMARK OFFICE
CERTIFICATE OF CORRECTION

PATENT NO. : 4,365,284
DATED : December 21, 1982
INVENTOR(S) : Katsuo Tanaka

It is certified that error appears in the above-identified patent and that said Letters Patent is hereby corrected as shown below:

Column 4, line 28, after "connected" insert --to--.

Signed and Sealed this

Fifth Day of April 1983

[SEAL]

Attest:

GERALD J. MOSSINGHOFF

Attesting Officer       Commissioner of Patents and Trademarks